US005651013A

United States Patent [19]

Iadanza

[11] Patent Number: 5,651,013
[45] Date of Patent: Jul. 22, 1997

[54] PROGRAMMABLE CIRCUITS FOR TEST AND OPERATION OF PROGRAMMABLE GATE ARRAYS

[75] Inventor: Joseph Andrew Iadanza, Hinesburg, Vt.

[73] Assignee: International Business Machines Corporation, Armonk, N.Y.

[21] Appl. No.: 557,219

[22] Filed: Nov. 14, 1995

[51] Int. Cl.[6] ................................................ G01R 31/28
[52] U.S. Cl. ................. 371/22.3; 371/22.2; 371/22.1; 371/22.5
[58] Field of Search ................................. 371/22.3, 22.1, 371/22.2, 22.5; 377/80, 77; 307/465; 340/825.83

[56] References Cited

U.S. PATENT DOCUMENTS

| | | | |
|---|---|---|---|
| 4,063,080 | 12/1977 | Eichelberger et al. | 235/302 |
| 4,140,967 | 2/1979 | Balasubramanian et al. | 324/73 R |
| 4,177,452 | 12/1979 | Balasubramanian et al. | 340/166 R |
| 4,225,957 | 9/1980 | Doty, Jr. et al. | 371/15 |
| 4,404,635 | 9/1983 | Flaker | 364/481 |
| 4,441,075 | 4/1984 | McMahon | 324/73 R |
| 4,476,431 | 10/1984 | Blum | 324/73 R |
| 4,495,629 | 1/1985 | Zasio et al. | 377/70 |
| 4,503,386 | 3/1985 | DasGupta et al. | 324/73 R |
| 4,504,784 | 3/1985 | Goel et al. | 324/73 R |
| 4,509,008 | 4/1985 | DasGupta et al. | 324/73 R |
| 4,553,236 | 11/1985 | Zasio et al. | 371/15 |
| 4,635,261 | 1/1987 | Anderson et al. | 371/25 |
| 4,684,830 | 8/1987 | Tsui et al. | 307/465 |
| 4,749,947 | 6/1988 | Gheewala | 324/73 R |
| 4,761,768 | 8/1988 | Turner et al. | 365/201 |
| 4,771,285 | 9/1988 | Agrawal et al. | 340/825.83 |
| 4,780,628 | 10/1988 | Illman | 307/465 |
| 4,780,874 | 10/1988 | Lenoski et al. | 371/25 |
| 4,782,283 | 11/1988 | Zasio | 324/73 R |
| 4,855,669 | 8/1989 | Mahoney | 324/73 R |
| 4,857,774 | 8/1989 | El-Ayat et al. | 307/465 |
| 4,893,311 | 1/1990 | Hunter et al. | 371/22.5 |
| 4,980,889 | 12/1990 | DeGuise et al. | 371/22.3 |
| 5,047,710 | 9/1991 | Mahoney | 324/158 R |
| 5,218,245 | 6/1993 | Kohler et al. | 307/465 |
| 5,250,852 | 10/1993 | Ovens et al. | 307/272.2 |
| 5,257,223 | 10/1993 | Dervisoglu | 365/154 |
| 5,285,453 | 2/1994 | Gruodis | 371/27 |
| 5,291,079 | 3/1994 | Goetting | 307/465 |
| 5,298,805 | 3/1994 | Garverick et al. | 307/465 |
| 5,337,255 | 8/1994 | Seidel et al. | 364/489 |
| 5,367,551 | 11/1994 | Okumura et al. | 377/80 |
| 5,459,735 | 10/1995 | Narimatsu | 371/22.3 |

OTHER PUBLICATIONS

Wagner, P.T., "Interconnect Testing With Boundary Scan," Paper 2.2, 1987 International Test Conference, IEEE, pp. 52–57.

Primary Examiner—Robert W. Beausoliel, Jr.
Assistant Examiner—Nadeem Iqbal
Attorney, Agent, or Firm—Heslin & Rothenberg, P.C.; Susan M. Murray, Esq.

[57] ABSTRACT

A system for scan testing a programmable array of logic cells is provided. The storage circuits of the logic cells are converted into master/slave storage circuits and connected into a shift register for scan testing. The storage circuits require A, B and C clocks during operation. A programmable clock splitter is provided having a first configuration wherein user-supplied A, B and C clocks are provided directly to A, B and C clock inputs of the storage circuits. The programmable switch has a second configuration wherein the A clock is inactivated and the B and C clocks are derived from a single B or C clock signal source. A programmable switch is provided for programmably providing a clock from either the user-supplied A, B and C clock signal sources or an alternative clock signal source. The programmable clock splitter and switch include circuitry for deriving two clocks from alternate phases of a single input clock. Various configurations of the programmable clock splitter and switch are disclosed which provide differing levels of clock selectivity to the logic cells.

29 Claims, 10 Drawing Sheets

PROGRAMMABLE CIRCUITS FOR TEST AND OPERATION OF PROGRAMMABLE GATE ARRAYS

RELATED APPLICATION INFORMATION

This application relates to commonly owned previously filed U.S. patent applications:

1. Ser. No.: 08/460,481, filed Jun. 2, 1995, entitled "PROGRAMMABLE LOGIC CELL;"
2. Ser. No.: 08/459,156, filed Jun. 2, 1995, entitled "PROGRAMMABLE ARRAY CLOCK/RESET RESOURCE;"
3. Ser. No.: 08/460,420, filed Jun. 2, 1995, entitled "PROGRAMMABLE ARRAY I/O-ROUTING RESOURCE;"and
4. Ser. No.: 08/459,579, filed Jun. 2, 1995, entitled "PROGRAMMABLE ARRAY INTERCONNECT NETWORK."

The section entitled "Description of the Preferred Embodiment(s)," and the drawings, from each of the above-referenced related U.S. patent applications are hereby expressly incorporated herein by reference.

TECHNICAL FIELD

The present invention relates to test systems and strategies for semiconductor integrated circuits, and in particular to test and clock distribution systems and strategies for programmable gate arrays.

BACKGROUND OF THE INVENTION

Field-programmable gate arrays ("FPGAs") are known to those skilled in the art to include arrays of uncommitted, programmable logic cells having both combinational and sequential logic circuits therein. The logic cells are conventionally programmably interconnected with a programmable interconnect network. A complex user-defined logic function can thus be performed by an FPGA by appropriately programming and interconnecting the logic cells. It is desirous to provide a test strategy for the programmable resources provided in an FPGA.

Test strategies and systems are known in the art. Boundary scan techniques involve the provision of dual latch sets at the perimeter of a chip, in association with the I/O terminals. The latches are connected into a shift register. Test stimuli are loaded into a first latch of each set, applied to the internal circuit, and the second latch of each set is used to receive the response of the circuit to the test stimuli. These results can then be shifted out of the shift register and compared to expected results. Scan-in, scan-out, and several clock terminals are provided, and faults can be detected in the circuit without requiring an external test circuit at each I/O terminal. However, with increasing circuit densities, and especially considering the heterogeneous nature of the circuits in an FPGA, fault detection may be possible with boundary scan techniques, but fault isolation may be difficult. It is thus desirous to employ test systems which provide a larger degree of fault isolation, especially considering the density and heterogeneous nature of the resources and subsystems in an FPGA.

Level-sensitive scan design ("LSSD") test techniques are also known and involve segmenting a logic circuit into combinational and sequential logic circuitry. The sequential circuits are connected into a shift register which bound or segment regions of the combinational circuitry. Like boundary scan techniques, test stimuli are shifted into the resultant shift registers, applied to the combinational regions, and results are collected into the shift registers and shifted out for analysis. Again, reduced pin count testing is achieved because external test equipment need only access the scan-in, scan-out and appropriate clock pins.

The shift registers, or scan chains, require multiple scan clocks to operate. In addition, the shift registers, if used during operation and test, require clocks during both operation and test. Often, a user supplies clocks from a single clock source when operating the shift registers during test. In fact, a user may simultaneously test multiple integrated circuit devices at a card or board level, one or more of which may be an FPGA. When testing multiple integrated circuit devices, it is often desirable to employ a single test clock source and wiring. Having installed the wiring to support an operational clock source, it is desirous to use the same wiring to support a test clock signal source, so that wiring need not be supported for both operational and test clock signals.

Many FPGAs also include highly programmable operational clock distribution networks. One such network is disclosed in the above-incorporated sections of the U.S. patent application entitled "PROGRAMMABLE ARRAY CLOCK/RESET RESOURCE." The clock network disclosed therein accepts multiple clocks from off-chip sources. The network includes multiple levels of multiplexing for providing a high degree of operational clock selectivity in the array. However, LSSD scan clock multiplexing is not currently supported by this network. If storage circuits supported by such a network are also to be used for scan testing, it is necessary to integrate into the array a scan clock distribution strategy. In addition, it would be desirable to provide additional user options regarding the source from which to derive operational clocks, e.g., from the existing clock distribution network or a scan clock distribution network.

In summary, high-density FPGAs require test strategies having high degrees of fault isolation. If a scan chain is to be employed for testing, scan clock distribution strategies are required. These strategies should support, in one aspect, a single set of wiring for both operation and test. In addition, if a programmable clock network already exists in the array, the strategies should provide additional flexibility regarding the sources of the clocks used during operation and test.

SUMMARY OF THE INVENTION

Briefly described, the invention in one aspect is a programmable array having a plurality of programmable logic cells and a programmable interconnect network, wherein each of the logic cells includes combinational logic for performing a logic function on logic cell input signals. Each logic cell also includes a storage circuit having a first data input connected to the combinational logic output, a second data input connected to the output of a second data storage circuit of another of the logic cells, the connected storage circuits thereby forming a portion of a shift register, and an output for providing a storage circuit output signal to at least one of the interconnect network and a third storage circuit in another of the logic cells.

The first storage circuit may include a master and a slave section, and a first clock input for receiving a first clock signal which clocks into the master section a signal received at the first data input. The first storage circuit also includes a second clock input for receiving a second clock signal which clocks into the master section a signal received at the second data input, and a third clock input for receiving a third clock signal which clocks into the slave section a signal received from the master section.

Each of the logic cells of the programmable array may also have associated therewith at least one alternative clock signal source for providing at least one alternative clock signal, and a programmable switch connected between first and third clock signal sources, the at least one alternative clock signal source, and the respective first and third clock inputs. The programmable switch provides first and third clock signals to the respective first and third clock inputs, the first and third clock signals being programmably derived by the programmable switch from either the first and third clock signal sources or the at least one alternative clock signal source.

Each of the logic cells may have a dedicated programmable switch connected thereto, or a single programmable switch may be commonly connected between each of at least some of the logic cells and the first, third and alternative clock signal sources.

At least some of the logic cells in the interconnect network can be designed to be testable using LSSD scan techniques in which case the shift register comprises a scan chain for scan testing the logic cells and the portions of the interconnect network. For LSSD scan testing, the first clock signal is an LSSD master C clock, the second clock signal is an LSSD scan A clock, and the third clock signal is an LSSD slave B clock.

The first and third clock signals produced by the programmable switch can be derived from alternate phases of the at least one alternative clock signal. In addition, the alternative clock signal source may be an operational clock distribution network of the programmable array.

In another aspect of the invention, an integrated circuit is provided having: a plurality of storage circuits connected into a shift register, and a first programmable clock splitter having an input for each of first (C type) and second (B type) input clock signals, and having an output for each of first and second output clock signals, the first and second output clock signals being applied to the plurality of storage circuits for operation thereof. The first programmable clock splitter is programmable into at least two configurations, including a first configuration wherein each of the first and second output clock signals is independently derived by the first programmable clock splitter from a respective one of the first and second input clock signals. A second configuration is provided wherein both the first and second output clock signals are derived by the first programmable clock splitter from alternate phases of one of the first and second input clock signals.

The first programmable clock splitter may further include an input for a third input clock signal (A type) and an output for a third output clock signal. The third output clock signal is also applied to the plurality of storage circuits for operation thereof. The programmable clock splitter is further programmable such that the third output clock signal can be derived from one of the third input clock signal and an inactive signal. In one embodiment, in the second configuration, the third output clock signal is derived from the inactive signal.

The integrated circuit may further include a plurality of logic cells, each of the logic cells including combinational logic and at least one respective storage circuit of the plurality of storage circuits. An output of the combinational logic of each cell is applied to its respective storage circuit, and an interconnect network for interconnecting the logic cells is provided.

At least some of the logic cells and portions of the interconnect network are designed to be testable using LSSD scan techniques and the shift register therefore will comprise a scan chain for scan testing the logic cells and the portions of the interconnect network.

Each storage circuit may have associated therewith a programmable switch for programmably providing to each respective storage circuit a clock signal derived from the first and second output clock signals of the programmable clock splitter or a clock signal derived from an operational clock distribution network.

In yet another aspect of the invention, an integrated circuit is provided having a plurality of master/slave storage circuits therein, the plurality of storage circuits for holding data during circuit operation and being connected into a shift register for scan testing the integrated circuit. During scan testing, a plurality of user-supplied clock signals are employed to operate the storage circuits. The integrated circuit includes a programmable clock splitter for providing a plurality of output clock signals for operating the plurality of storage circuits. The splitter is programmable into a first configuration wherein first, second and third output clock signals are derived from corresponding ones of the plurality of user-supplied signals, and a second configuration wherein the first and second output clock signals are derived from an active one of the user-supplied clock signals and the third output clock signal is inactivated.

The plurality of user-supplied clock signals and the output clock signals may comprise A type, B type and C type clocks, normally associated with LSSD scan systems.

At least some of the plurality of storage circuits may have associated therewith a first programmable switch for programmably applying to the respective storage circuit clock signals derived from the A type, B type and C type user-supplied clock signals or clock signals derived from an alternative clock source.

The programmable switch may be connected between the programmable clock splitter, the alternative clock source and the storage circuits for programmably providing either the output clock signals from the programmable clock splitter or clock signals derived from the alternative clock source to the storage circuits. The integrated circuit may include a plurality of programmable switches, the plurality of programmable switches including the first programmable switch, each programmable switch corresponding to a respective one of at least some of the plurality of storage circuits. Each of the programmable switches may include a circuit for deriving two clock signals from alternate phases of a single clock respectively received from the alternative clock source.

The user-supplied signal source may comprise an A, B or C clock signal source and an alternative clock signal source, in which case the programmable switch is connected between the A, B or C clock signal source, the alternative clock signal source, and the programmable clock splitter for programmably providing to the programmable clock splitter a B or C clock from either the A, B or C clock signal source or the alternative clock signal source. In this configuration, the B and C type output clock signals are derived by the programmable clock splitter using alternate phases of the B or C clock provided to the programmable clock splitter from the programmable switch.

The present invention, by providing storage circuits in programmable logic cells of a programmable array, offers an effective capability for factory and field testing of the array. In addition, the programmable switches and the programmable clock splitters of the present invention afford a user the option to use common clock wiring during operation and test, and further afford the user the option of providing clocks to the storage circuits from alternative or existing operational clock sources.

BRIEF DESCRIPTION OF THE DRAWINGS

The subject matter which is regarded as the invention is particularly pointed out and distinctly claimed in the concluding portion of the specification. The invention, however, both as to organization and method of practice, together with further aspects and advantages thereof, may best be understood by reference to the following description of preferred embodiment(s) and the accompanying drawings in which:

DESCRIPTION OF THE PREFERRED EMBODIMENT(S)

Figure 1:
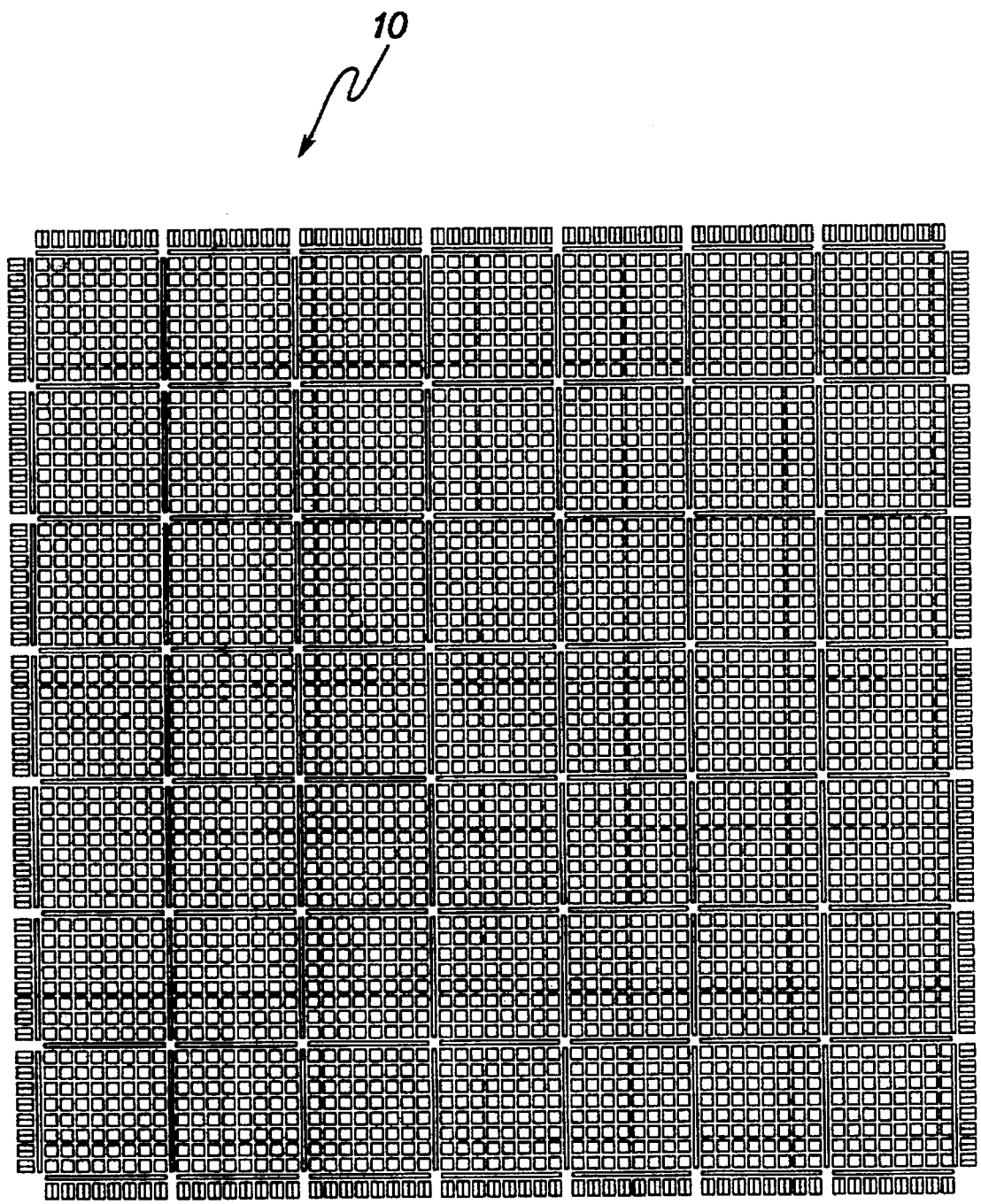
FIG. 1 depicts a programmable gate array.
Figure 2:
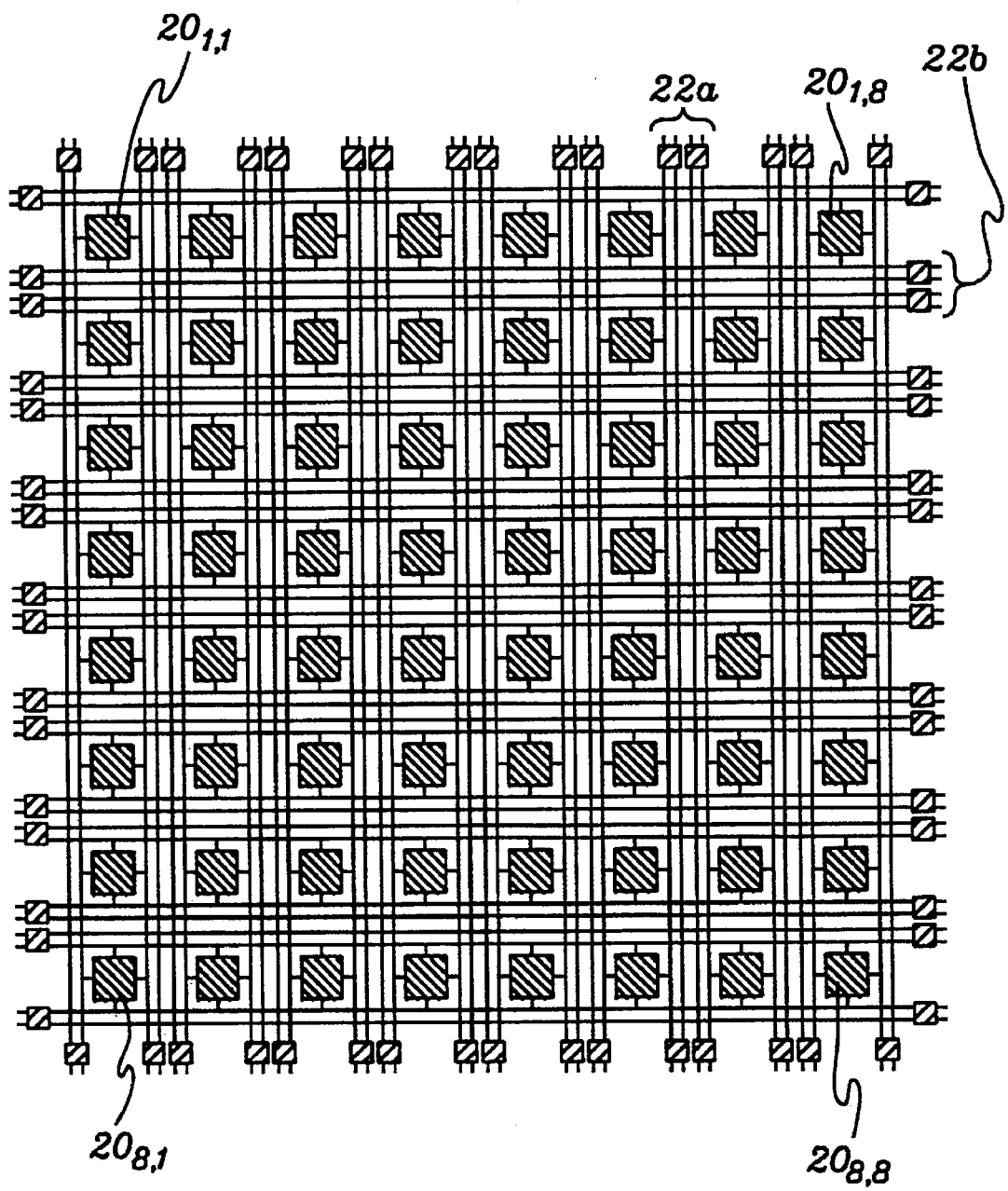
FIG. 2 depicts a sector of logic cells of the programmable array of FIG. 1 and portions of an interconnect network thereof.

As discussed above, a field-programmable gate array employs a symmetric array of logic cells. One such array 10 is shown in FIG. 1, and a single sector of logic cells $20_{1,1}$–$20_{8,8}$ is shown in FIG. 2. The array 10 of FIG. 1 may include multiple sectors of cells. Vertical and horizontal portions 22a and 22b of an interconnect network are also provided to programmably interconnect the cells. The logic cells, interconnect network and input/output systems of the programmable array can be implemented according to the incorporated sections of the above-referenced related applications.

Figure 3:
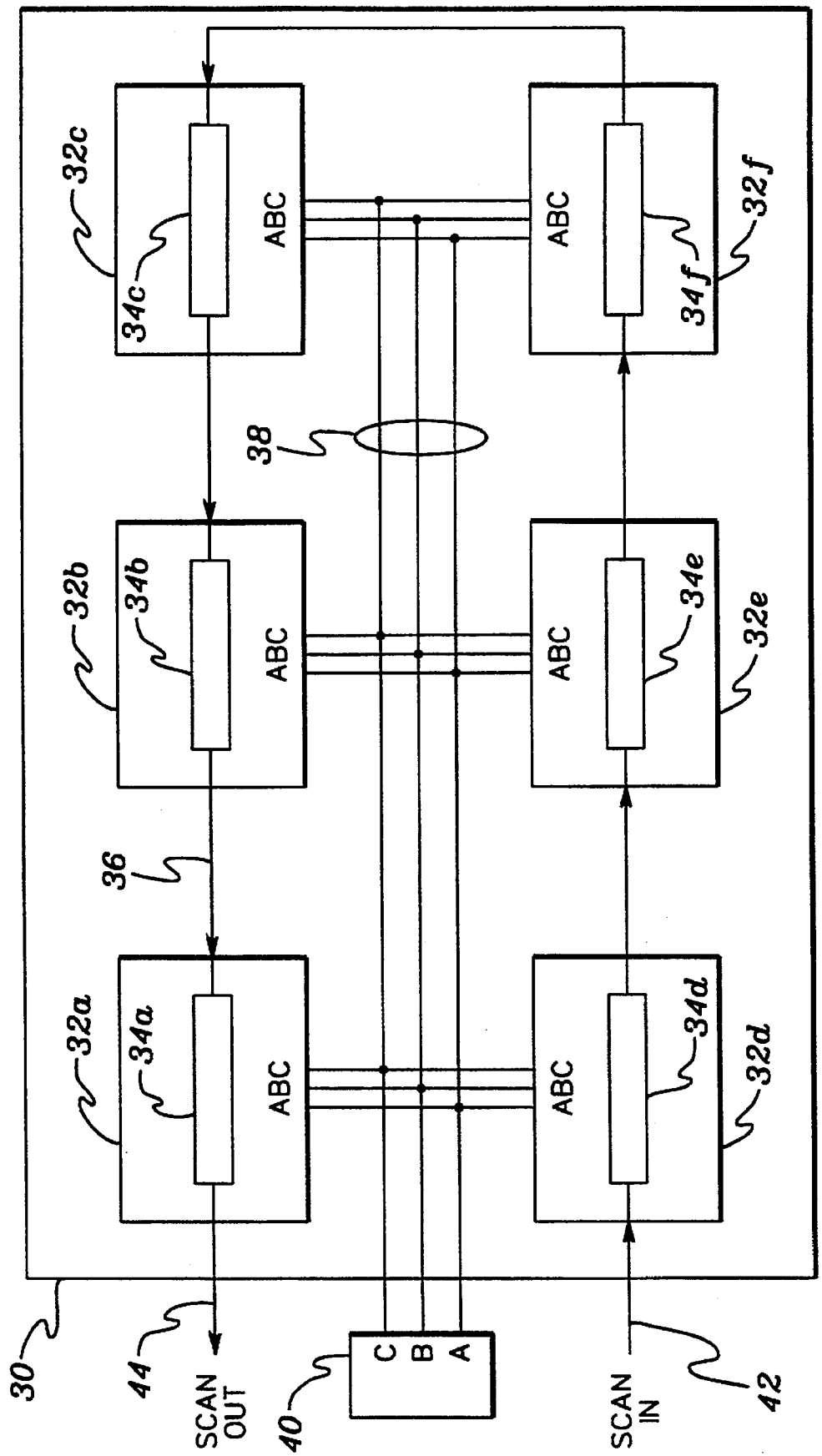
FIG. 3 depicts a system having multiple integrated circuits therein, the multiple integrated circuits having common test clocks and scan chains for testing thereof.

A programmable array may be part of a larger logic system. One such system 30 is shown in FIG. 3. System 30 includes integrated circuits 32a–f, any number of which may be a programmable array. To provide circuit testability, each integrated circuit may include a respective shift register scan chain 34 (either boundary scan or LSSD). The storage circuits of each shift register conventionally require three non-overlapping clocks to operate, i.e., A type, B type and C type clocks 38. Multiple shift registers 34a–f of respective integrated circuits 32 can themselves be cascaded to form a larger scan chain (using, e.g., line 36) and a system scan input 42 and a system scan output 44 are provided to operate the scan chain. Regardless of whether all of the integrated circuits are tested using a large, combined scan chain as shown, or tested individually using each respective scan chain (and individual scan inputs and outputs, not shown) it is often desirable to employ a single clock source 40 for the required A, B and C clocks. FIG. 3 illustrates the wiring 38 employed to route the clock signals from a common clock source 40 to each of the integrated circuits 32.

Level sensitive scan design "LSSD," and boundary scan techniques are known to those of ordinary skill in the art, and exemplary implementations of the same are described in: commonly assigned U.S. Pat. No. 3,783,254 to Eichelberger, Jan. 1, 1974; "A LOGIC DESIGN STRUCTURE FOR LSI TESTABILITY," E. B. Eichelberger and T. W. Williams, The Proceedings of the Design Automation Conference, 1977; "DESIGN FOR TESTABILITY—A SURVEY", Thomas W. Williams and Kenneth P. Parker, IEEE Transactions on Computers, Vol. C-31, No. 1, January 1982; and "BOUNDARY-SCAN DESIGN PRINCIPLES FOR EFFICIENT LSSD ASIC TESTING," R. W. Basset, M. E. Turner, J. H. Paner, P. S. Gillis, S. F. Oakland, D. W. Stout, IBM Journal of Research and Development, Vol. 34, No. 2–3, pp. 339–354. Each of the above-named sources is hereby incorporated herein by reference in its entirety.

In accordance with the present invention, the storage circuits normally associated with operational signal storage in the logic cells of a programmable array are converted into individual shift register stages, and connected into shift registers thereby providing a level of testability for programmable arrays. The combinational logic and possibly portions of the interconnect network, if designed using proper LSSD design rules, should therefore be testable with the converted storage circuits.

Figure 4:
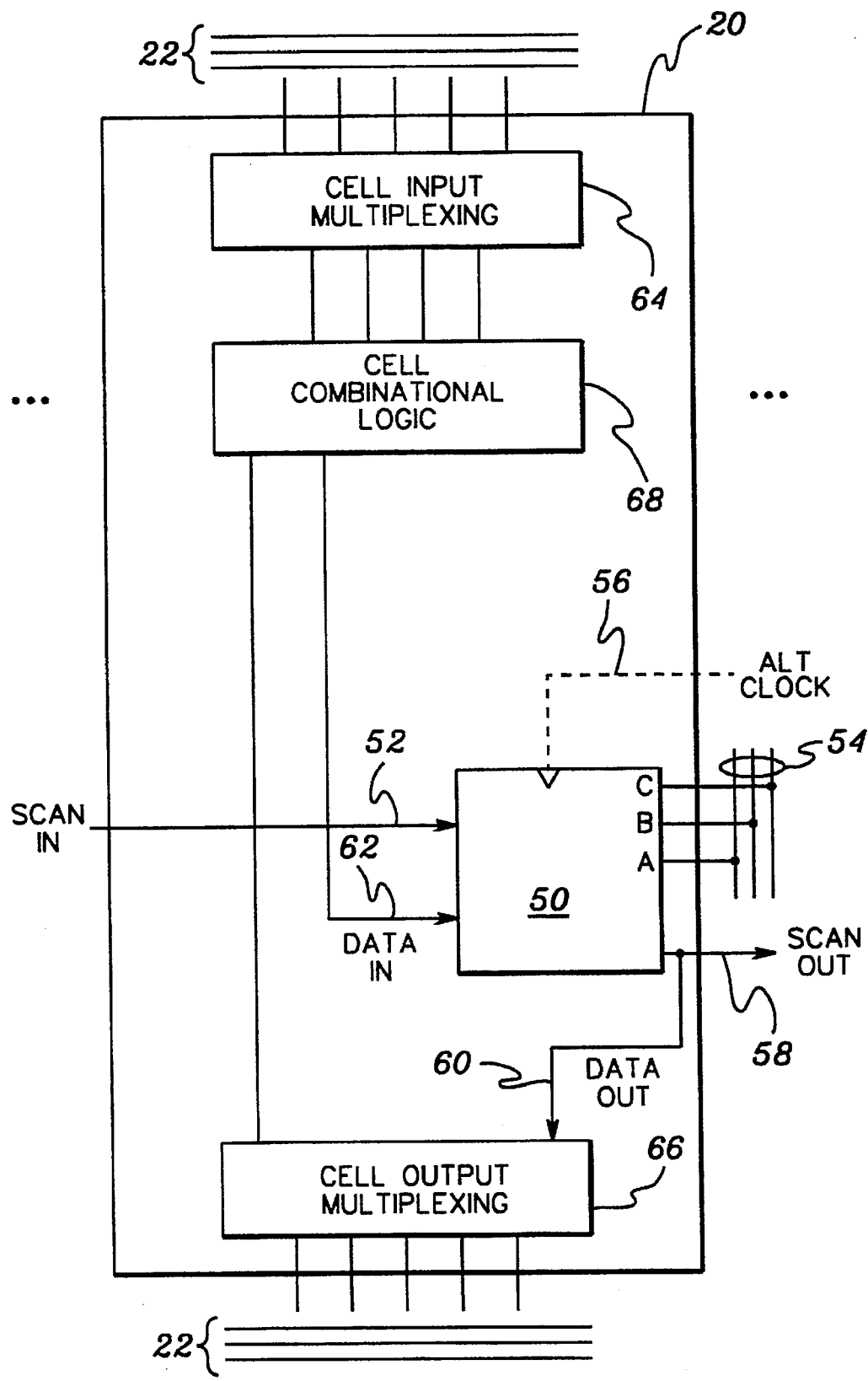
FIG. 4 depicts a logic cell having combinational logic and a storage circuit converted into a shift register stage in accordance with the principles of the present invention.

With reference to FIG. 4, shown therein is a logic cell 20 having cell input multiplexing 64 and output multiplexing 66 which effect the connections between the logic cell 20 and the programmable interconnect network 22. (Like reference numerals are used for like elements throughout the drawings and description herein.) Also depicted in cell 20 is cell combinational logic 68 which performs logic functions on logic cell input signals and which produces at least one resultant logic signal 62. Signal 62 is applied to a storage circuit 50. In accordance with the present invention, storage circuit 50, which conventionally is a master/slave D flip-flop having an output 60, is converted into a shift register stage having a scan input 52, a scan output 58 and inputs for A, B and C scan clock signals from a scan clock distribution network 54. (Those skilled in the art will recognize that multiple such storage circuits can be provided in a single logic cell.) In addition, and as discussed further below, the converted storage circuit 50 may still support an input 56 from an operational clock network already installed in the programmable array. Each storage circuit 50 of each logic cell 20 of a programmable array can be converted and connected into a scan chain using its respective scan input and scan output lines.

Figure 5:
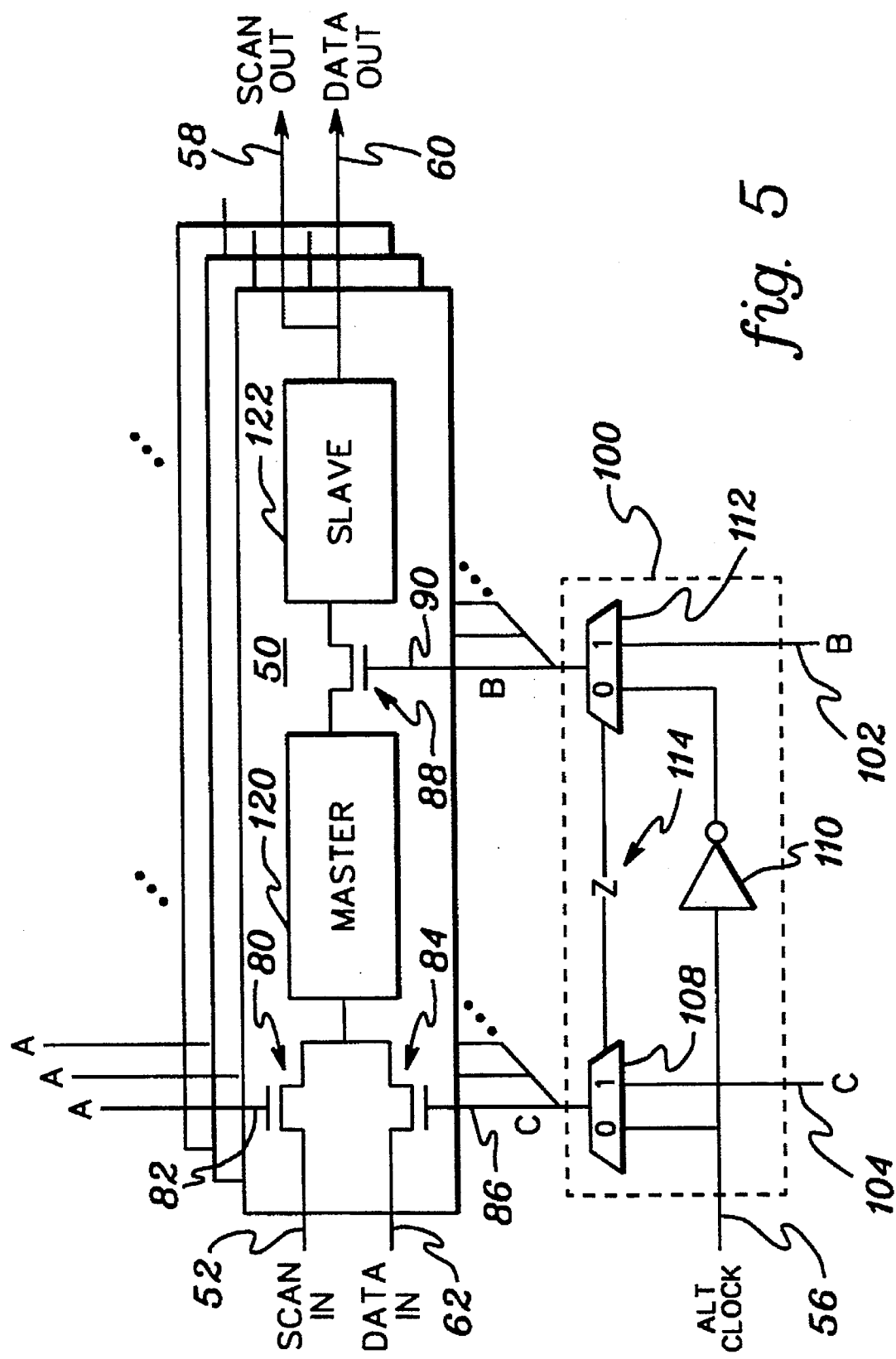
FIG. 5 depicts a plurality of master/slave storage circuits and a programmable switch associated therewith in accordance with the principles of the present invention.

FIG. 5 depicts a plurality of master/slave storage circuits converted into shift register stages in accordance with the principles of the present invention. (The surrounding portions of the logic cells are not shown, for clarity.) More particularly, each shift register stage 50 includes a master section 120 and a slave section 122. The master and slave sections of the master/slave storage circuit can be implemented using any one of a number of configurations known to those skilled in the art. For example, each master and slave section can comprise a cross-coupled pair of inverters.

The inputs 52 and 62 are applied to the master section via either pass transistor 80 using control signal 82 or via pass transistor 84 using control signal 86. Input 52 is a scan input from a previous shift register stage, and the control signal 82 is normally referred to as the A clock signal. If input 62 is the input from cell combinational logic, control signal 86 is normally referred to as the C or master clock signal. The coupling between the master and slave sections is controlled via pass transistor 88 and control signal 90, usually referred to as the B or slave clock signal. Slave section 122 produces scan output 58 to be applied to the next shift register stage, and data output 60 to be applied to an operational resource, such as interconnect network 22.

In accordance with the principles of the present invention, each storage circuit 50 has a programmable switch 100 associated therewith. Programmable switch 100 allows a selection to be made between providing either the B and C type clocks from sources 102 and 104, or from an alternative clock source 56 (for example, an existing operational clock distribution network). Programmable switch units can be implemented using any one of a number of techniques known to those skilled in the art. In the exemplary embodiment shown, the programmable switch includes multiplexers 108 and 112 using a common control signal "Z" 114. The programmable control of the multiplexers using signal 114 can be accomplished in any one of a number of ways, as discussed further below.

If the "0" inputs to the multiplexers 108 and 112 are selected, clock signals derived from clock signal 56 are applied to transistors 84 and 88. More particularly, the true version of the clock signal from line 56 is applied to clock input 86, and the complement version of the clock is provided to clock input 90 of the storage circuit through inverter 110. Thus, the programmable switch produces clocks from alternate phases of a single clock signal 56. Those skilled in the art will recognize that a single clock pulse from line 56 will clock into the master section an input signal from input 62, and subsequently clock from the master section into the slave section the same signal. Thus, by using the alternate phases of the alternative clock signal 56, storage circuit 50 performs its normal function, i.e., a D flip-flop.

If the control signal 114 selects the "1" inputs to multiplexers 108 and 112, the signals applied to clock inputs 86 and 90 of the storage circuit 50 are simply the signals present at the C and B inputs respectively, from the test clock distribution network. As discussed below, these input clock signals can be used either during test or operation of the programmable array.

In the exemplary embodiment shown, the programmable switch 100 is commonly connected between clock sources 56, 102 and 104, and a plurality of storage circuits 50. However, depending on the granularity of clock selection required, a dedicated programmable switch 100 could be employed for each storage circuit 50.

Figure 6A:
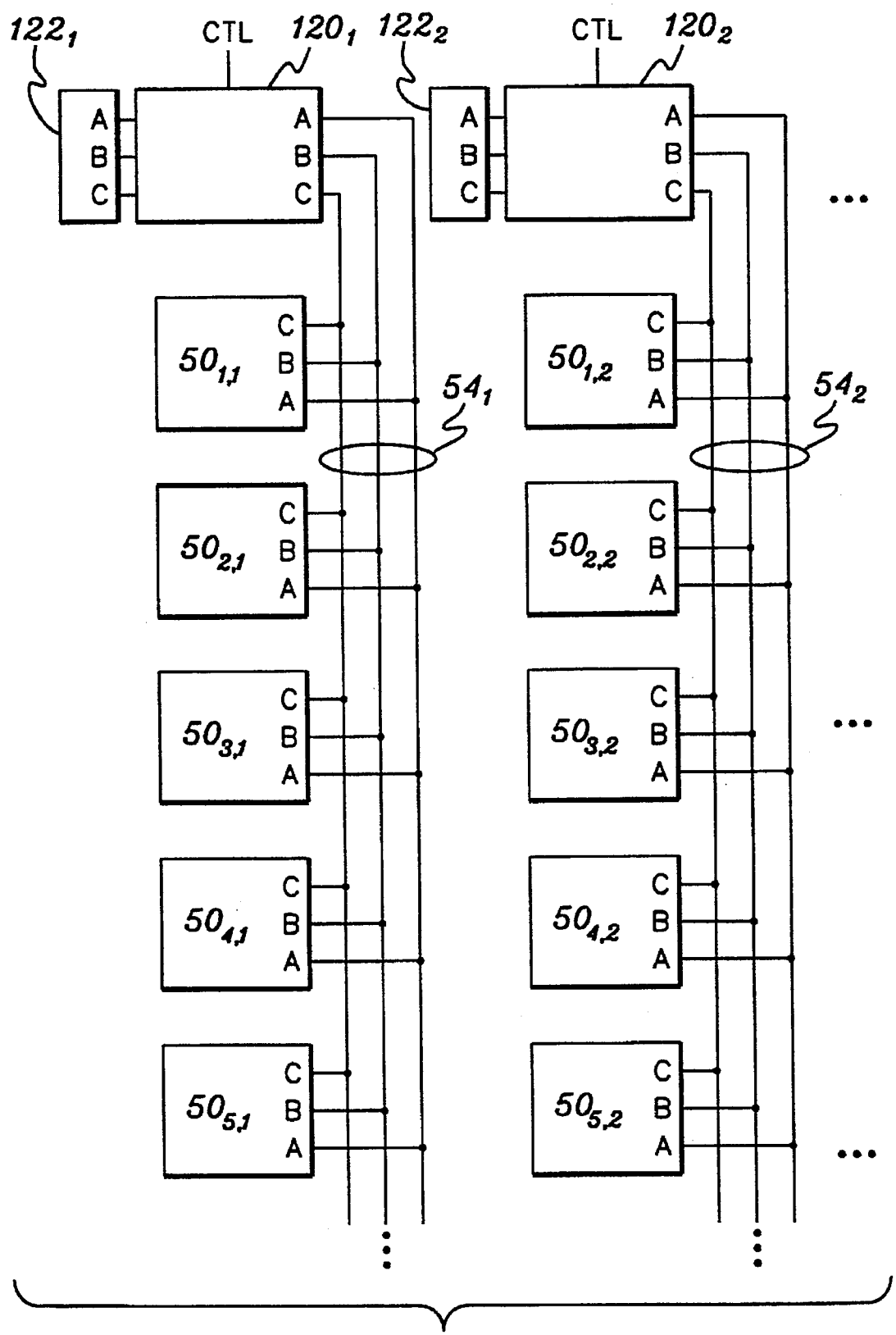
FIGS. 6a–d depict four respective embodiments of multiple storage circuits having programmable clock splitters and programmable switches associated therewith in accordance with the principles of the present invention.

As discussed above (and independent of the operational or alternative clock source), a user may require use of a common set of clock lines during both operation and test. FIG. 6a depicts an embodiment of the present invention in which programmable clock splitters 120 are provided for respective pluralities of storage circuits 50. The programmable clock splitters provide an interface between the A, B and C clock sources $122_1$ and $122_2$ and the storage circuits 50 (for clarity, the logic cell circuitry assumed to be associated with and connected to each storage circuit 50 is not shown). The clock splitters employ the same output wiring, i.e., networks $54_1$ and $54_2$, regardless of their current mode. The term "source," when used herein, broadly denotes a single circuit for providing multiple clock signals, multiple circuits for providing multiple clock signals, etc. A source can be as simple as an off-board clock generator, or as complex as an on-board clock distribution network in which multiple levels of clock selection are possible. The A, B, and C signals are depicted as produced from a single source 122 herein for clarity only.

Figure 8A:
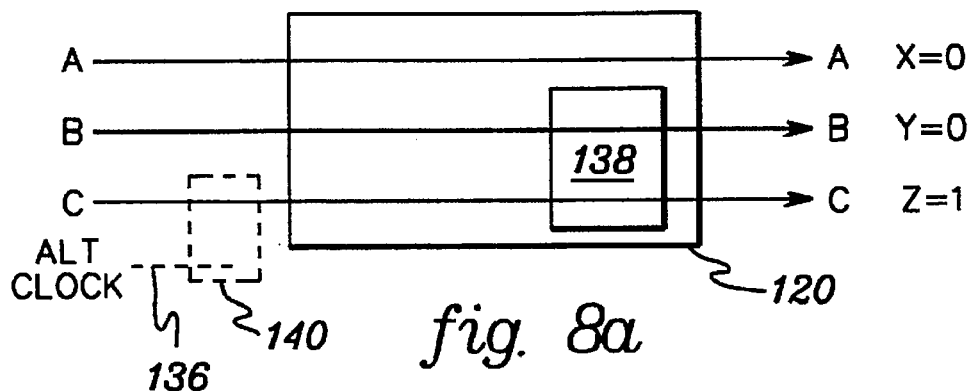
FIGS. 8a–d depict the functional modes possible using the programmable switch and the programmable clock splitter of the present invention.
Figure 8B:
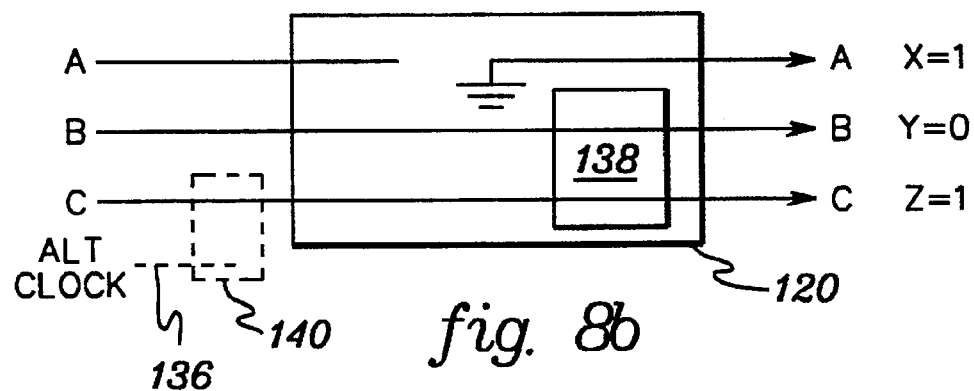
Figure 8C:
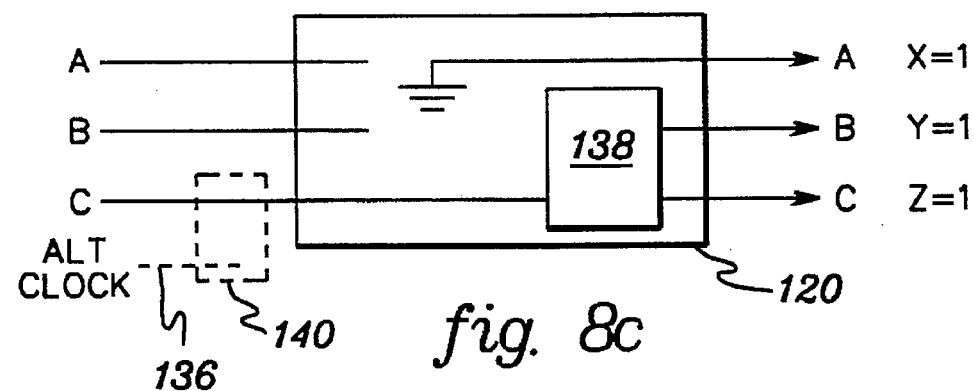
Figure 8D:
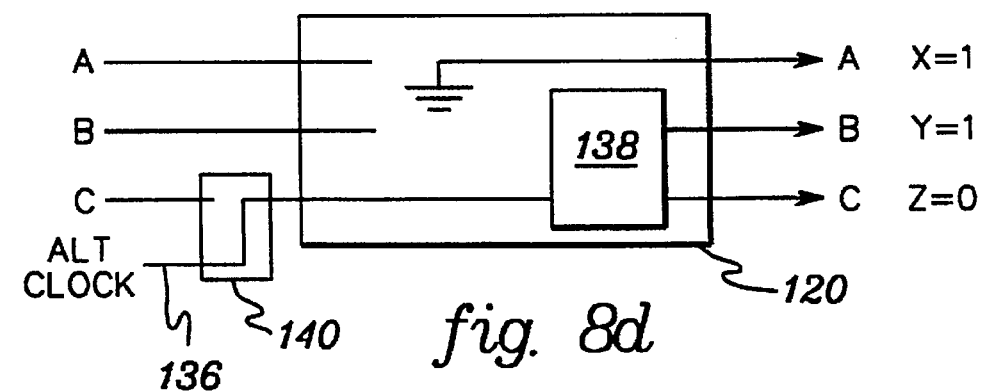

Programmable clock splitters 120 are programmable into at least three modes (see FIGS. 8a–c for a functional diagram of these modes):

Mode 0: programmable splitter 120 provides output A, B and C clock signals which are each derived from corresponding A, B and C input signals from source 122. In essence, the programmable splitter simply passes each of these clock signals from its input to its output. Mode 0 thus allows a user to provide full A, B and C clocking from an A, B and C clock signal source.

Mode 1: In this mode, the programmable splitter applies B and C output clock signals to its output lines, which B and C output clock signals are derived from the respective B and C input clock signals from the clock signal source 122. In addition, the programmable splitter inactivates the A output signal. Thus, in this mode, the storage circuits 50 are most likely used in an operational mode, however, the user is providing operational clocking via the B and C clock signal lines.

Mode 2: In this mode, the B and C signals output from the programmable clock splitter are both derived from the alternate phases of any one of the input clock signals. Thus, the user is given an option of providing a single input clock to the programmable clock splitter, wherein the programmable splitter derives two separate B and C output clocks to operate the storage circuits 50. In addition, in mode 2, the A output clock signal can again be inactivated.

The modes identified above, i.e., modes 0, 1 and 2, correspond respectively to full user test, user operation using user-supplied B and C clocks, and user operation using a single input clock.

Figures 6B, 6C:
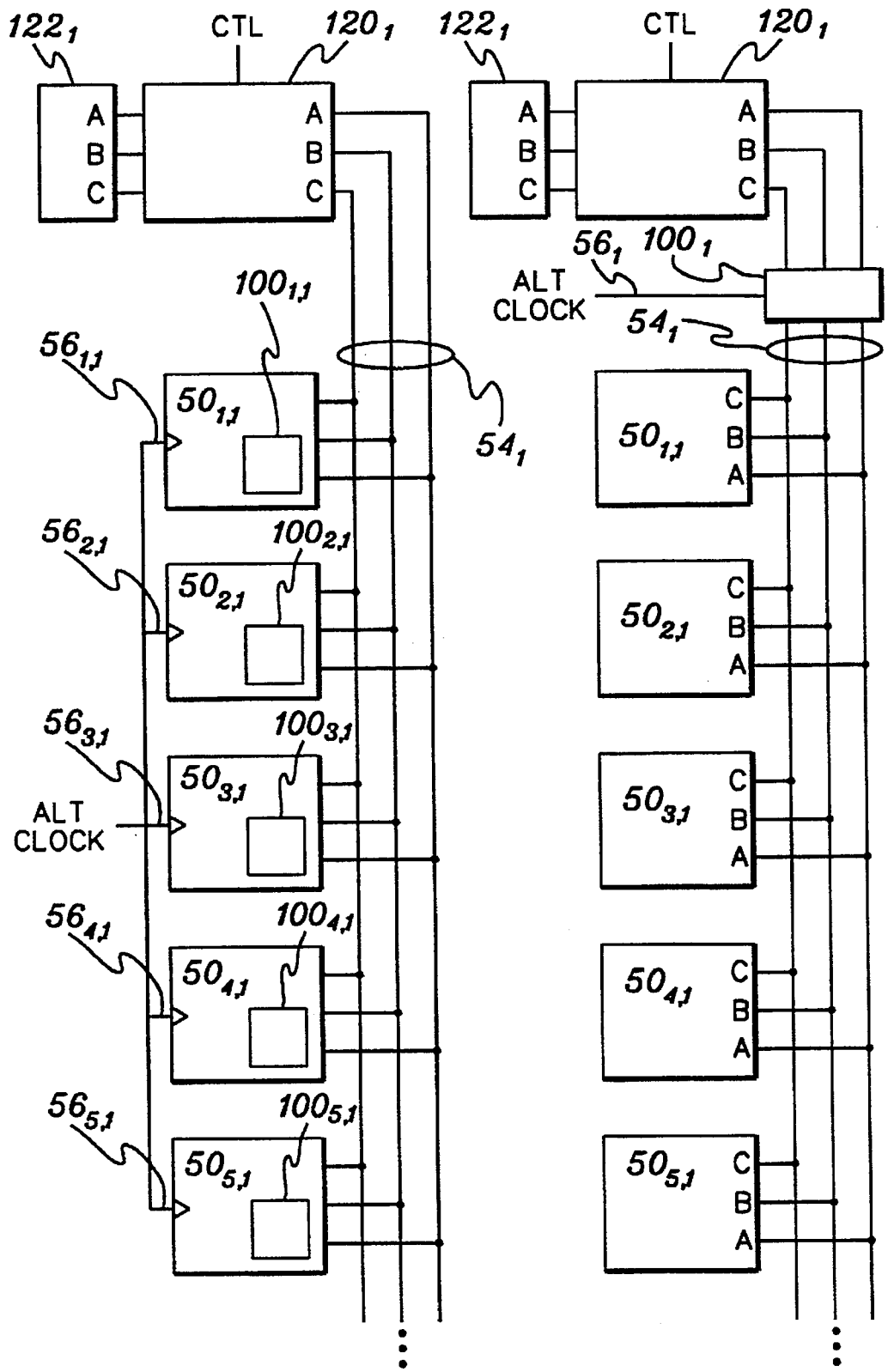

FIG. 6b depicts an embodiment of the present invention in which a plurality of storage circuits $50_{1,1}$–$50_{5,1}$ are again associated with a programmable clock splitter $120_1$ and in which A, B and C clocks are provided via network $54_1$. (Unlike FIG. 6a, FIGS. 6b–d depict only a single column/group of circuits 50.) In addition, the embodiment of FIG. 6b includes a programmable switch 100 employed in association with each of the storage circuits 50 for programmably providing either the B and C clock from programmable switch $120_1$ or alternative clocks $56_{1,1}$–$56_{5,1}$ from an alternative clock source. Again, as discussed above, this alternative clock source may be a programmable clock distribution network provided with the programmable array. Programmable switches 100 are discussed above in detail with respect to FIG. 5. Though shown within the storage circuits, those skilled in the art will recognize that placement of the programmable switches is merely a design choice, depending upon the particular implementation. In addition, clocks $56_{1,1}$–$56_{5,1}$ could each comprise separate clocks derived from alternative clock source(s). The frequency of programmable switches in this embodiment, i.e., one for each storage circuit 50, allows different clock configurations to be applied to different storage circuits. Thus, one portion of an array can be programmed to operate using the alternative clock source, and other portions of the array can be programmed to use the clock signals on the A, B and C clock lines 54, on a cell by cell basis.

FIG. 6c depicts another embodiment of the present invention wherein a single programmable switch $100_1$ is placed between a programmable clock splitter $120_1$ and a plurality of storage circuits $50_{1,1}$–$50_{5,1}$. In this embodiment, the programmable switch receives a single alternative clock signal from an alternative clock source on line $56_1$, and can selectively provide a clock signal on the B and C lines derived from that alternative clock, or derived from the clock signals provided by the programmable clock splitter $120_1$. A programmable switch in this embodiment merely passes the A clock signal unaltered. In this embodiment, a single programmable switch is provided for a plurality of storage circuits, thus, the selectivity provided for clocks from the alternative clock source is coarser than the selectivity provided by the embodiment of FIG. 6b, however, the chip area occupied by programmable switching hardware is reduced.

Figure 6D:
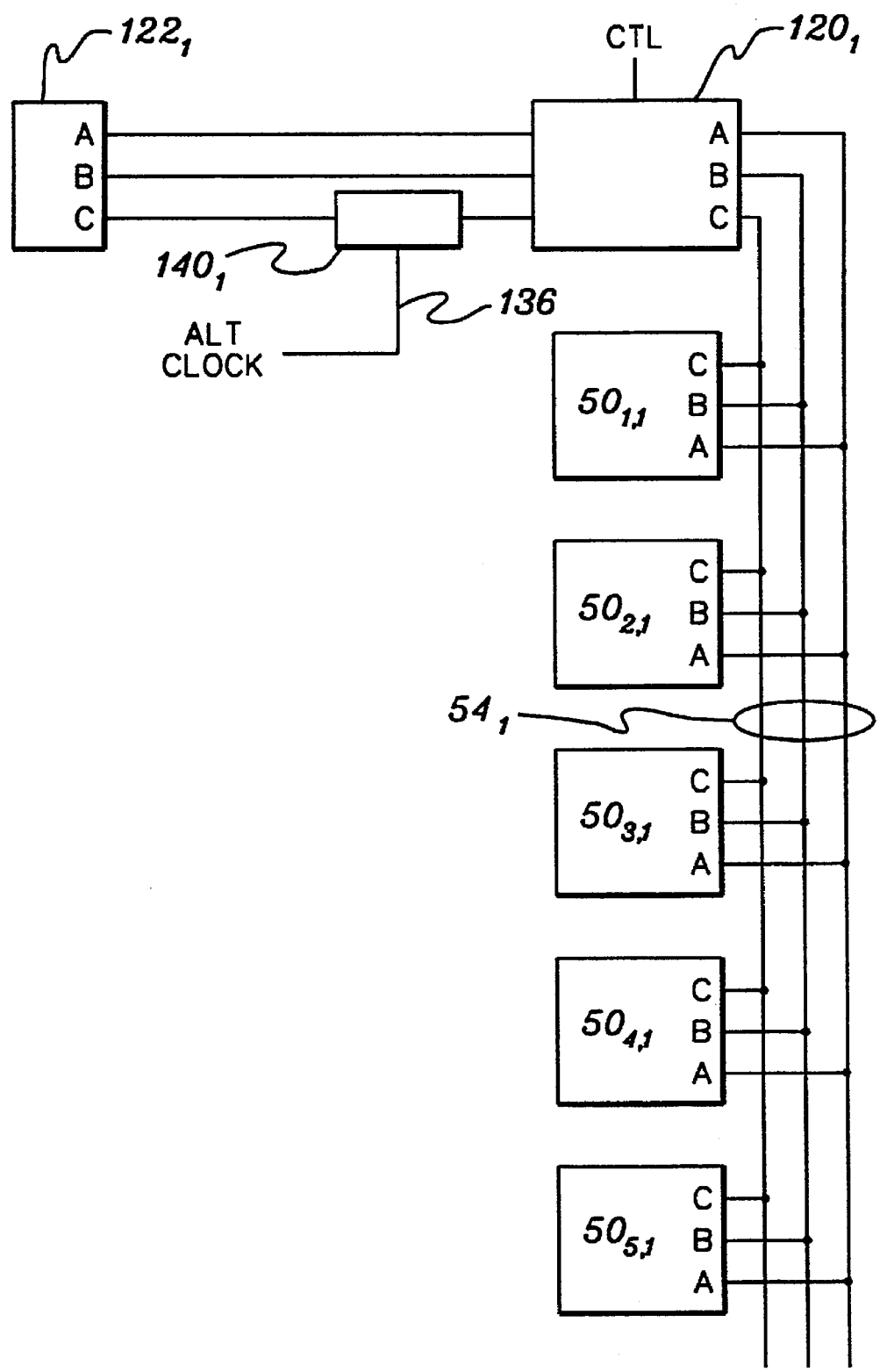

FIG. 6d represents yet another embodiment of the present invention wherein a modified programmable switch $140_1$ is placed between a clock source $122_1$ for the A, B and C clock signals and the programmable clock splitter $120_1$. Again, a single programmable clock splitter is provided for a plurality of storage circuits 50. In this embodiment, as discussed further below, a single instance of clock phasing circuitry is shared between the modified programmable switch $140_1$ and the programmable clock splitter $120_1$. The clock signal selectivity from the alternate clock source on line 136 in the embodiment of FIG. 6d is again somewhat coarser than the embodiment of FIG. 6b, because common clock lines $54_1$ are applied to each of the plurality of storage circuits 50 from the combination of switch $140_1$ and splitter $120_1$.

Figure 7:
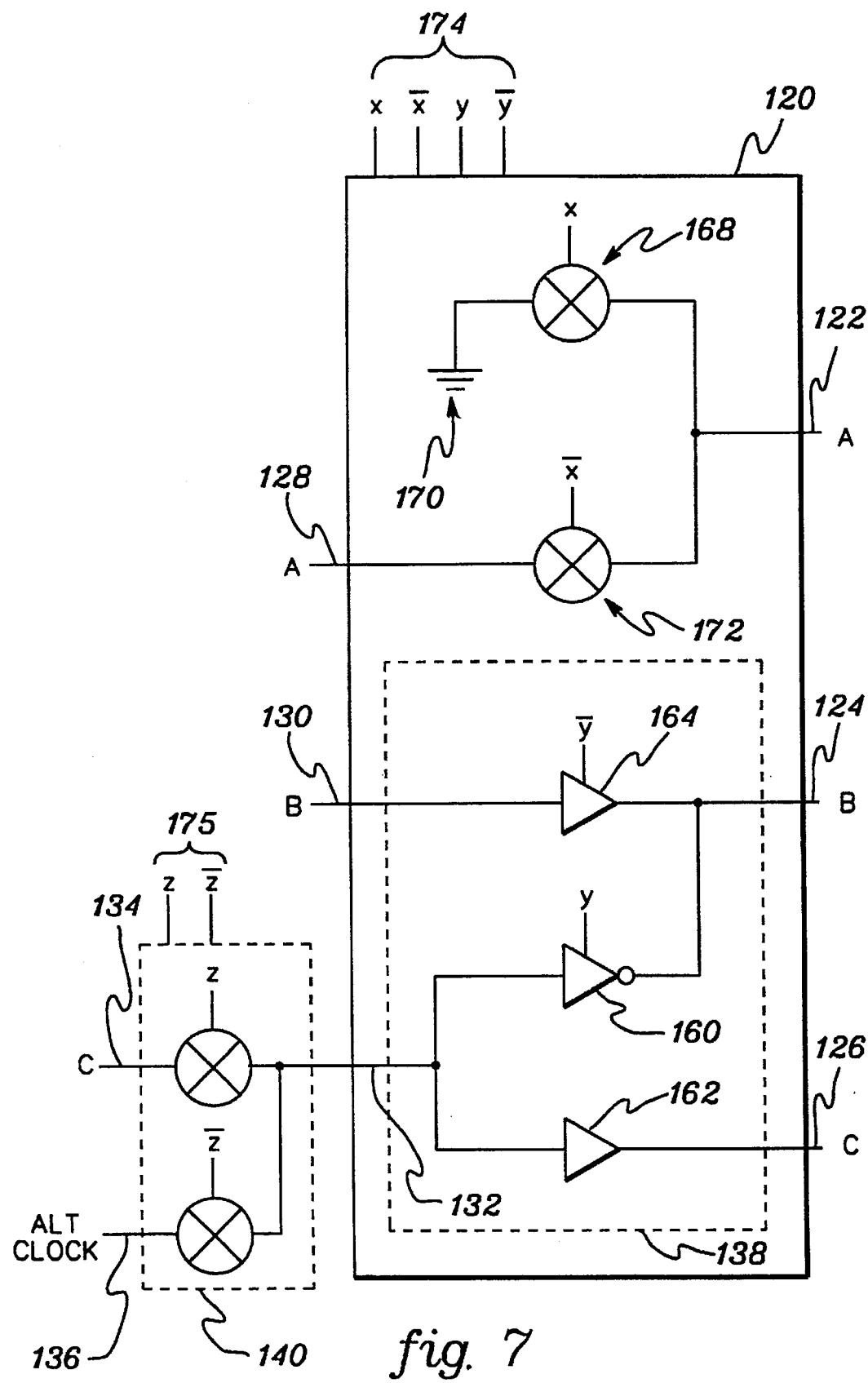
FIG. 7 is a schematic of one embodiment of a programmable clock splitter and optional programmable switch in accordance with the principles of the present invention.

FIG. 7 is an exemplary schematic of a programmable clock splitter 120 and an optional modified programmable switch 140. Control signals 174 and 175 are provided to program the splitter and switch. As discussed above, the programmable clock splitter has inputs 128, 130 and 134 for A, B and C type clock signals. The A signal path, a simple orthogonally controlled pair of pass gates 168 and 172, is provided and controlled by a control signal X and its complement. The signal produced on line 122 is thus either the signal from input line 128 or an inactive signal from a fixed voltage source, such as ground 170. As discussed above, if a user is employing the storage circuits in an operational mode, the signal on line 122 is likely inactivated, thus inactivating the scan chain.

The B and C clock paths include clock phasing circuitry 138 including orthogonally controlled tri-state inverter 160 and tri-state buffer 164, and buffer 162. As discussed above, in modes 0 and 1, output clock signals provided on the B and C output lines 124 and 126 are independently derived from the input B and C clock signals on lines 130 and 134. In these modes, buffer 164 is activated, and buffer 160 is placed in tri-state mode in which no signal is passed therethrough.

In mode 2, the signal provided on the B and C clock output lines 124 and 126 are derived from a single input clock line shown, for example, on clock line 132, the C clock line. In this mode, buffer 164 is placed in a tri-state mode, and tri-state inverter 160 is activated. Thus, a true version of the signal is passed through buffer 162 to the C clock output signal line 136, and an inverted version of the signal is provided on the B output signal line 124. As discussed above with reference to FIG. 5, these alternate phases of the clock signal are employed to operate the master/slave sections of the storage circuits attached thereto.

Those skilled in the art will recognize that independent control of all pass gates, inverters and buffers can also be provided.

Also depicted in FIG. 7 is an optional, modified programmable switch 140 discussed above in connection with FIG. 6d which includes a pair of orthogonally controlled pass-gates for passing either the signal on line 136 from an alternative clock source or a signal on line 134 from a C clock signal source. As discussed above with reference to FIG. 6d, functionality of the programmable switch is thus provided, and the clock phasing circuitry necessary to provide B and C clock output signals is thus shared between the programmable clock splitter 120 and the programmable switch 140.

Those skilled in the art will recognize that alternative clock phasing techniques are available for the switches and splitters of the present invention. For example, delays can be inserted to ensure that the resultant clock pulses are adequately non-overlapping. The switches and splitters of the present invention can also employ selective inversion such that certain portions of the array can operate with falling edge triggered latches and other portions can operate with rising edge triggered latches.

FIGS. 8a–8d represent the state of the control signals X, Y and Z in each of modes 0–3 respectively, assuming that the optional programmable switch 140 is provided. In addition, the functional clock paths through the programmable clock splitter 120, circuit 138 and the optional programmable switch 140 are also depicted.

Various technologies are known to those skilled in the art to provide array programmability and the required X, Y and Z control signals for the programmable switches and splitters of the present invention. Any of these techniques, or variants thereof, can be used to program the architecture of the present invention. Mask programming techniques include customizing the deposition of the final layers of metallization of an otherwise generally designed integrated circuit (see, for example, U.S. Pat. No. 3,993,919 to Cox et al. entitled "PROGRAMMABLE LATCH AND OTHER CIRCUITS FOR LOGIC ARRAYS," Nov. 23, 1976; and U.S. Pat. No. 4,742,383 to Fitzgerald entitled "MULTI-FUNCTION FET MASTERSLICE CELL," May 3, 1988; both patents assigned to the same assignee as the present application). Laser programming techniques involve customizing the metallization layers following their deposition (see, for example, Raffel et al., "A WAFER-SCALE DIGITAL INTEGRATOR USING RESTRUCTURABLE VSLI," IEEE Journal of Solid-State Circuits, Vol. SC-20, No. 1, February 1985, at pg. 399). Fusible links or antifuses can be employed and offer permanent (non-volatile) programming (see, for example, Millman, "MICROELECTRONICS," McGraw-Hill, Inc., 1979, at pg. 196; and U.S. Pat. No. 4,758,745 to El Gamal et al. entitled "USER PROGRAMMABLE INTEGRATED CIRCUIT INTERCONNECT ARCHITECTURE AND TEST METHOD," Jul. 19, 1988). Erasable programmable read only memory ("EPROM") and electrically erasable programmable read only memory ("EEPROM") devices can be used and offer semi-permanent programming. EPROMS and EEPROMS are both electrically programmable and hold their states, even if power is removed. Special erase procedures can be used, however, to reconfigure the devices (see, for example, Wood et al., "AN ELECTRICALLY ALTERABLE PLA FOR FAST TURN-AROUND TIME VLSI DEVELOPMENT HARDWARE," IEEE Journal of Solid-State Circuits, Vol. SC-16; No. 5, October 1981, at pg. 570). Finally, volatile random access memory ("RAM") devices are also available which are fully programmable and reprogrammable, but which lose their programmed state if power is removed (see, for example, U.S. Pat. No. 4,177,452 to Balasubramanian et al., Dec. 4, 1979, assigned to the same assignee as the present application). These and other techniques for programming arrays are known to those in the art and are also generally described in the publication entitled "FIELD-PROGRAMMABLE GATE ARRAYS" by S. Brown, R. Francis, J. Rose and Z. Vranesic, Kluwer Academic Publishers, 1992. Each of the above-named sources is hereby incorporated herein by reference in its entirety.

Programming the splitters and switches of a preferred embodiment of the present invention involves SRAM cells, programmed by a user. The array SRAM cells can be configured in accordance with the techniques disclosed in the publication entitled "APPLICATION NOTE AT6000 SERIES CONFIGURATION," May 1993, Revision 1B, Atmel Corporation, which is hereby incorporated herein by reference in its entirety. In another embodiment, the user could be given control of the switches and splitters directly via chip pins, independent of the programming technique employed for the array itself. If the array is hardwired, user control of the splitters and switches remains.

Those skilled in the art will recognize that the programmable clock splitters and programmable clock switches of the present invention can be distributed throughout a programmable array at any desired frequency, thus providing any desired degree of clock selection. A splitter and switch can be provided for each logic cell of the programmable array, or groups of logic cells. Naturally, the amount of control lines required increases as the number of independently controllable splitters and switches increases. Portions of the array could thereby be controlled independently and placed into different modes.

By converting the D flip-flops of the logic cells of a programmable array into shift register stages, pursuant to the present invention, a test system is provided having a high degree of fault isolation for dense arrays. In addition, the present invention provides scan clock distribution strategies which support a single set of wiring routed to the shift register stages for both operation and test. Programmable switches have also been provided, thereby offering an additional level of selectivity between the A, B and C clock lines and an alternative clock distribution network.

While the invention has been described in detail herein in accordance with certain preferred embodiments thereof, many modifications and changes therein may be effected by those skilled in the art. Accordingly, it is intended by the following claims to cover all such modifications and changes as fall within the true spirit and scope of the invention.

I claim:

1. A programmable array having a plurality of programmable logic cells and a programmable interconnect network, each of at least some of the logic cells being arranged within a symmetric two dimensional array of logic cells and comprising:

combinational logic for performing a logic function on logic cell input signals; and a first storage circuit having: a first data input connected to an output of the combinational logic for receiving a combinational logic output signal therefrom, a second data input connected to an output of a second storage circuit in another of the at least some of the logic cells, the connected storage circuits thereby forming a portion of a shift register, and a data output for providing a storage circuit output signal to at least one of the interconnect network and a third storage circuit in another of the at least some of the logic cells;

wherein the first storage circuit further includes:
a master section;
a slave section;
a first clock input for receiving a first clock signal, the first clock signal for clocking into the master section a signal received at the first data input;
a second clock input for receiving a second clock signal, the second clock signal for clocking into the master section a signal received at the second data input; and
a third clock input for receiving a third clock signal, the third clock signal for clocking into the slave section a signal received from the master section;

wherein each of the at least some of the logic cells has associated therewith:
at least one alternative clock signal source for providing at least one alternative clock signal; and
a programmable switch connected between first and third clock signal sources, the at least one alternative clock signal source, and the respective first and third clock inputs, the programmable switch for providing first and third clock signals to the respective first and third clock inputs, the first and third clock signals being programmably derived by the programmable switch from either the first and third clock signal sources or the at least one alternative clock signal source.

2. The programmable array of claim 1 wherein each of the at least some of the logic cells has a dedicated programmable switch connected thereto.

3. The programmable array of claim 1 wherein the programmable switch comprises a single programmable switch commonly connected between each of the at least some of the logic cells and the first, third and alternative clock signal sources.

4. The programmable array of claim 1 wherein the at least some of the logic cells and portions of the interconnect network are designed to be testable using LSSD scan techniques and wherein the shift register comprises a scan chain for scan testing the at least some of the logic cells and the portions of the interconnect network.

5. The programmable array of claim 4 wherein the first clock signal comprises an LSSD master C clock, the second clock signal comprises an LSSD scan A clock, and the third clock signal comprises an LSSD slave B clock.

6. The programmable array of claim 1 wherein the first and third clock signals are each derived from alternate phases of the at least one alternative clock signal by the programmable switch.

7. The programmable array of claim 1 wherein the alternative clock signal source comprises an operational clock distribution network of the programmable array.

8. An integrated circuit having a plurality of storage circuits connected into a shift register, the integrated circuit further comprising:

a first programmable clock splitter having an input for each of a first and a second input clock signal and having an output for each of a first and a second output clock signal, the first and second output clock signals being applied to the plurality of storage circuits for operation thereof, the first programmable clock splitter being programmable into at least two configurations, the at least two configurations including:

a first configuration wherein each of the first and second output clock signals is independently derived by the first programmable clock splitter from a respective one of the first and second input clock signals; and a second configuration wherein both the first and second output clock signals are derived by the first programmable clock splitter from alternate phases of one of the first and second input clock signals.

9. The integrated circuit of claim 8 wherein the first programmable clock splitter further includes an input for a third input clock signal, and an output for a third output clock signal, the third output clock signal being applied to the plurality of storage circuits for operation thereof, the programmable clock splitter being programmable such that the third output clock signal can be derived from one of the third input clock signal and an inactive signal.

10. The integrated circuit of claim 9 wherein, in the second configuration, the third output clock signal is derived from the inactive signal.

11. The integrated circuit of claim 8 further comprising:
a plurality of logic cells, each of at least some of the logic cells being arranged within a symmetric two dimensional array of logic cells and comprising combinational logic and at least one respective storage circuit of the plurality of storage circuits, an output of the combinational logic of each cell of the at least some of the logic cells being applied to a respective storage circuit; and
an interconnect network for interconnecting the at least some of the logic cells.

12. The integrated circuit of claim 11 wherein the at least some of the logic cells and portions of the interconnect network are designed to be testable using LSSD scan techniques and wherein the shift register comprises a scan chain for scan testing the at least some of the logic cells and the portions of the interconnect network.

13. The integrated circuit of claim 12 wherein the third input clock signal comprises an LSSD type A clock, the second input clock signal comprises an LSSD type B clock, and the first input clock signal comprises an LSSD type C clock.

14. The integrated circuit of claim 13 wherein at least one storage circuit of the plurality of storage circuits includes a master section and a slave section, and wherein, for the at least one storage circuit:
the first output clock signal of the programmable clock splitter applied to the storage circuit clocks into the master section data received from the respective combinational logic;
the second output clock signal of the programmable clock splitter applied to the storage circuit clocks into the slave section data received from the master section; and
the third output clock signal of the programmable clock splitter applied to the storage circuit clocks into the master section data received from a preceding source in the shift register.

15. The integrated circuit of claim 11 comprising a plurality of programmable clock splitters, the plurality of programmable clock splitters including the first programmable clock splitter, wherein each of the plurality of programmable clock splitters provides output clock signals for respective pluralities of storage circuits.

16. The integrated circuit of claim 15 further comprising an operational clock distribution network for providing alternate clock signals to the respective pluralities of storage circuits, the operational clock distribution network having a distribution point for each respective plurality of storage circuits.

17. The integrated circuit of claim 16 wherein each storage circuit of at least some of the respective pluralities of logic circuits has associated therewith a programmable switch for programmably providing to each respective storage circuit a clock signal derived from the first and second output signals of a respective programmable clock splitter or a clock signal derived from the operational clock distribution network.

18. An integrated circuit having a plurality of master/slave storage circuits therein, the plurality of storage circuits for holding data during circuit operation and being connected into a shift register for scan testing the integrated circuit, and wherein, during scan testing, a plurality of user-supplied clock signals from a user-supplied clock signal source are employed to operate the storage circuits, the integrated circuit further comprising:
a programmable clock splitter for providing a plurality of output clock signals for operating the plurality of storage circuits, the clock splitter being programmable into a first configuration wherein first, second and third output clock signals are derived from corresponding ones of the plurality of user-supplied clock signals, and a second configuration wherein the first and second output clock signals are derived from an active one of the user-supplied clock signals and the third output clock signal is inactivated.

19. The integrated circuit of claim 18 wherein the plurality of user-supplied clock signals and the plurality of output clock signals comprise A type, B type and C type clocks, the A type clock for clocking data into each storage circuit from a preceding source in the shift register, the B type clock for clocking data into a slave section of each storage circuit from a corresponding master section of each storage circuit, the C type clock for clocking data into each storage circuit from combinational logic of the integrated circuit.

20. The integrated circuit of claim 19 wherein in the first configuration of the programmable clock splitter, each of the A type, B type and C type output clock signals are derived from a corresponding one of the A type, B type and C type user-supplied clock signals.

21. The integrated circuit of claim 20 wherein, in the second configuration, the B type and C type output clock signals are derived by the programmable clock splitter using alternate phases of one of the B type and C type user-supplied clock signals, and the A type output clock signal is inactivated.

22. The integrated circuit of claim 21 further comprising a plurality of logic cells, each of at least some of the logic cells being arranged within a symmetric dimensional array of logic cells and comprising a respective one of the plurality of storage circuits.

23. The integrated circuit of claim 22 further comprising an alternative clock source and wherein at least some of the plurality of storage circuits have associated therewith a first programmable switch for programmably applying to the respective storage circuit clock signals derived from the A type, B type and C type user-supplied clock signals or clock signals derived from the alternative clock source.

24. The integrated circuit of claim 23 wherein the first programmable switch is connected between the programmable clock splitter, the alternative clock source, and the at least some of the plurality of storage circuits for programmably providing either the output clock signals from the programmable clock splitter or clock signals derived from the alternative clock source to the at least some of the plurality of storage circuits.

25. The integrated circuit of claim 24 further comprising a plurality of programmable switches, the plurality of programmable switches including the first programmable switch, each programmable switch corresponding to a respective one of the at least some of the plurality of storage circuits.

26. The integrated circuit of claim 25 wherein each of the programmable switches includes a circuit for deriving two clock signals from alternate phases of a single clock respectively received from the alternative clock source.

27. The integrated circuit of claim 24 wherein the first programmable switch includes a circuit for deriving two clock signals from alternate phases of a single clock received from the alternative clock source.

28. The integrated circuit of claim 23 wherein the user-supplied clock signal source comprises an A, B and C clock signal source and an alternative clock signal source, and wherein the programmable switch is connected between the A, B or C clock signal source, the alternative clock signal source and the programmable clock splitter for programmably providing to the programmable clock splitter a B or C clock from either the A, B or C clock signal source or the alternative clock signal source.

29. The integrated circuit of claim 28 wherein the B type and C type output clock signals from the programmable clock splitter are derived by the programmable clock splitter using alternate phases of the B or C clock provided to the programmable clock splitter from the programmable switch.

* * * * *